United States Patent [19]

Choudhury et al.

[11] Patent Number: 5,789,783
[45] Date of Patent: Aug. 4, 1998

[54] MULTILEVEL METALLIZATION STRUCTURE FOR INTEGRATED CIRCUIT I/O LINES FOR INCREASED CURRENT CAPACITY AND ESD PROTECTION

[75] Inventors: Ratan K. Choudhury, Milpitas; Ashok K. Kapoor, Palo Alto; Satish Menon, Milpitas, all of Calif.

[73] Assignee: LSI Logic Corporation, Milpitas, Calif.

[21] Appl. No.: 626,776

[22] Filed: Apr. 2, 1996

[51] Int. Cl.⁶ .......................... H01L 23/62; H01L 23/48
[52] U.S. Cl. ..................... 257/355; 257/363; 257/773
[58] Field of Search .................................. 257/355, 356, 257/357, 358, 359, 363, 773, 774, 538, 723, 752, 531, 207

[56] References Cited

U.S. PATENT DOCUMENTS

| | | | |
|---|---|---|---|
| 4,914,503 | 4/1990 | Shirato | 257/207 |
| 5,119,169 | 6/1992 | Kozono et al. | 257/207 |
| 5,446,311 | 8/1995 | Ewen et al. | 257/531 |
| 5,471,091 | 11/1995 | Pasch et al. | 257/752 |
| 5,475,264 | 12/1995 | Sudo et al. | 257/723 |

FOREIGN PATENT DOCUMENTS

| | | | |
|---|---|---|---|
| 62-8550 | 1/1987 | Japan | 257/538 |
| 2-90668 | 3/1990 | Japan | 257/538 |

*Primary Examiner*—Steven H. Loke
*Attorney, Agent, or Firm*—Oppenheimer Poms Smith

[57] ABSTRACT

A first metal layer is formed on a substrate of an integrated circuit and electrically interconnects a microelectronic device and an Input/Output (I/O) pad. A second metal layer is insulated from the first metal layer by a dielectric layer, and is connected directly only to the pad. A plurality of vias are formed through the dielectric layer, and electrically interconnect the first and second metal layers such that current can flow between the device and the pad through both metal layers and the vias. A higher scale of circuit integration is made possible by reducing the widths of the metal layers without reducing their combined current carrying capacity. An Electrostatic Discharge (ESD) protection device is connected to one or both of the first and second metal layers such that current can flow from the pad to the protection device during an ESD event through both metal layers and the vias. The increased current carrying capacity provided by the two metal layers and vias increases the resistance of the metal layers to damage induced by high current flow during ESD events.

20 Claims, 2 Drawing Sheets

MULTILEVEL METALLIZATION STRUCTURE FOR INTEGRATED CIRCUIT I/O LINES FOR INCREASED CURRENT CAPACITY AND ESD PROTECTION

BACKGROUND OF THE INVENTION

1. Field of the Invention

The present invention generally relates to the art of microelectronic integrated circuits, and more specifically to a multilevel metallization structure for integrated circuit I/O lines which provides increased current carrying capacity and electrostatic discharge (ESD) protection.

2. Description of the Related Art

In Metal Oxide Semiconductor (MOS) integrated circuits, input signals are applied to terminals which are connected to gates of MOS Field-Effect Transistors (FETs). If the voltage applied to the gate insulator becomes excessive, the gate oxide can break down.

The dielectric breakdown strength of $SiO_2$ is approximately $8 \times 10^6$ V/cm. Thus, a 15-nm gate oxide will not tolerate voltages greater than 12 V without breaking down. Although this is well in excess of the normal operating voltages of 5 V integrated circuits, voltages higher than this may be impressed upon the inputs to the circuits during either human-operator or mechanical handling operations.

The main source of such voltages is triboelectricity (electricity caused when two materials are rubbed together). A person can develop a very high static voltage (i.e., a few hundred to a few thousand volts) simply by walking across a room or by removing an integrated circuit from its plastic package, even when careful handling procedures are followed. If such a high voltage is accidentally applied to the pins of an integrated circuit package, its discharge (referred to as electrostatic discharge, or ESD) can cause breakdown of the gate oxide of the devices to which it is applied.

The breakdown event may cause sufficient damage to produce immediate destruction of the device, or it may weaken the oxide enough that it will fail early in the operating life of the device (and thereby cause device failure).

All pins of MOS integrated circuits must be provided with ESD protection circuits or devices to prevent such voltages from damaging the MOS gates. The need for such circuits is also mandated by the increasing use of VLSI devices in such high-noise environments as personal computers, automobiles, and manufacturing control systems.

These protective circuits, normally placed between the input and output pads on a chip and the transistor gates to which the pads are connected, are designed to begin conducting or to undergo breakdown, thereby providing an electrical path to ground (or to the power-supply rail). Since the breakdown mechanism is designed to be nondestructive, the circuits provide a normally open path that closes only when a high voltage appears at the input or output terminals, harmlessly discharging the node to which it is connected.

Constant efforts are being made to increase the scale of integration of microelectronic circuits by reducing the feature sizes of devices and interconnect wiring. A problem with reducing the width of wiring is that the current carrying capacity thereof is also reduced. If the wiring is made too narrow, insufficient current can flow therethrough to ensure proper operation of the circuitry.

Reducing the width of I/O lines correspondingly produces a smaller current carrying capacity between I/O pads and ESD protection devices. The current during an ESD event can be in the range of several amperes. If the I/O lines are too narrow, they can be damaged or destroyed by this level of current flow even if the ESD protection devices are able to handle the high voltage.

SUMMARY OF THE INVENTION

A multilevel metallization structure for integrated circuit Input/Output (I/O) lines according to the present invention provides increased current capacity, Electrostatic Discharge (ESD) protection, and scale of integration.

The structure comprises a first metal layer which is formed on a substrate of an integrated circuit and electrically interconnects a microelectronic device and an I/O pad. A second metal layer is insulated from the first metal layer by a dielectric layer, and is connected directly only to the pad.

A plurality of vias are formed through the dielectric layer, and electrically interconnect the first and metal layers such that current can flow between the device and the pad through both metal layers and the vias.

A higher scale of circuit integration is made possible by reducing the widths of the metal layers without reducing their combined current carrying capacity.

An ESD protection device is connected to one or both of the first and second metal layers such that current can flow from the pad to the protection device during an ESD event through both metal layers and the vias.

The increased current carrying capacity provided by the two metal layers and vias increases the resistance of the metal layers to damage induced by high current flow during ESD events.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
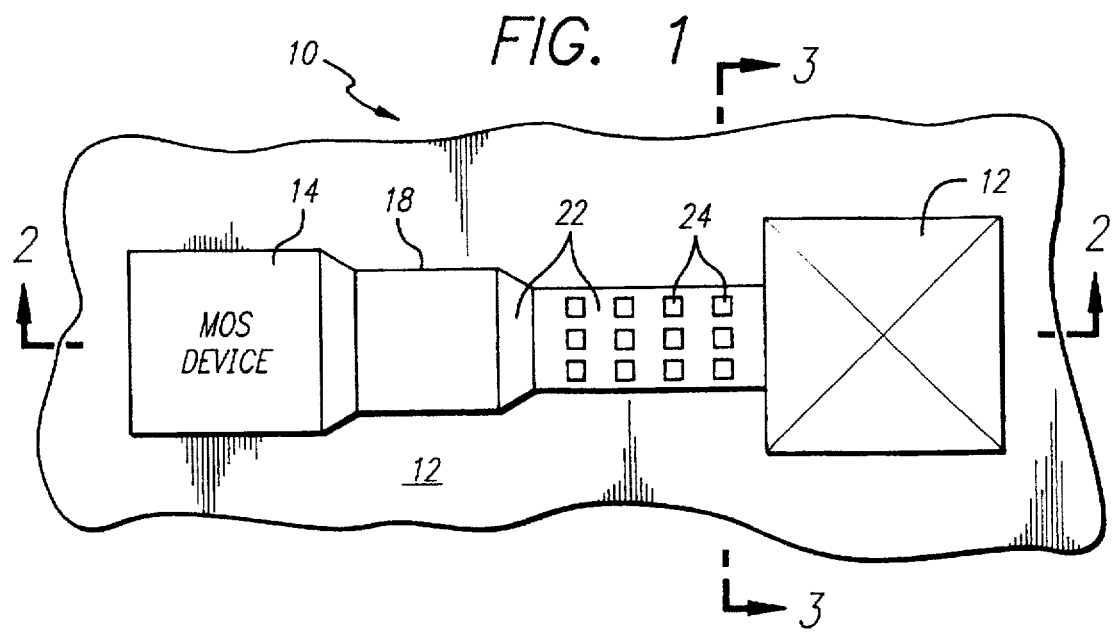
FIG. 1 is a plan view illustrating a microelectronic integrated circuit metallization structure according to the present invention.
Figure 2:
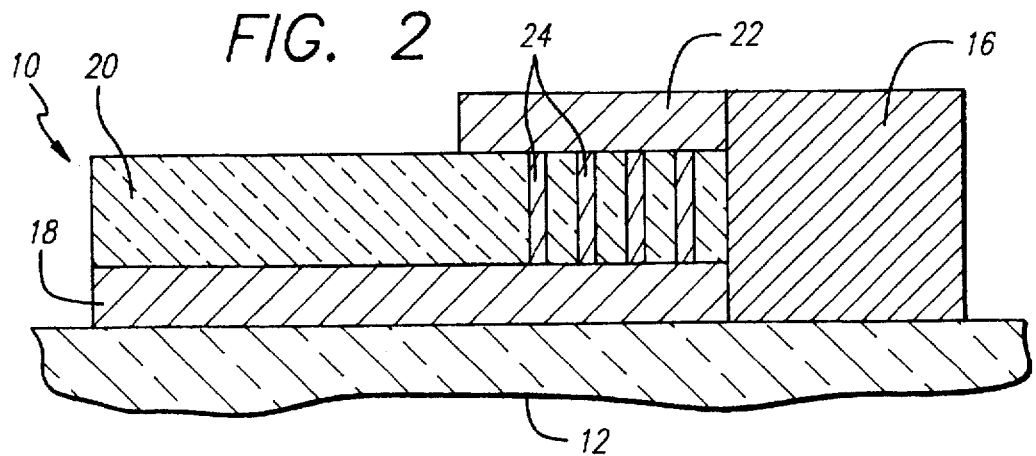
FIG. 2 is a sectional view taken on a line II—II of FIG. 1.
Figure 3:
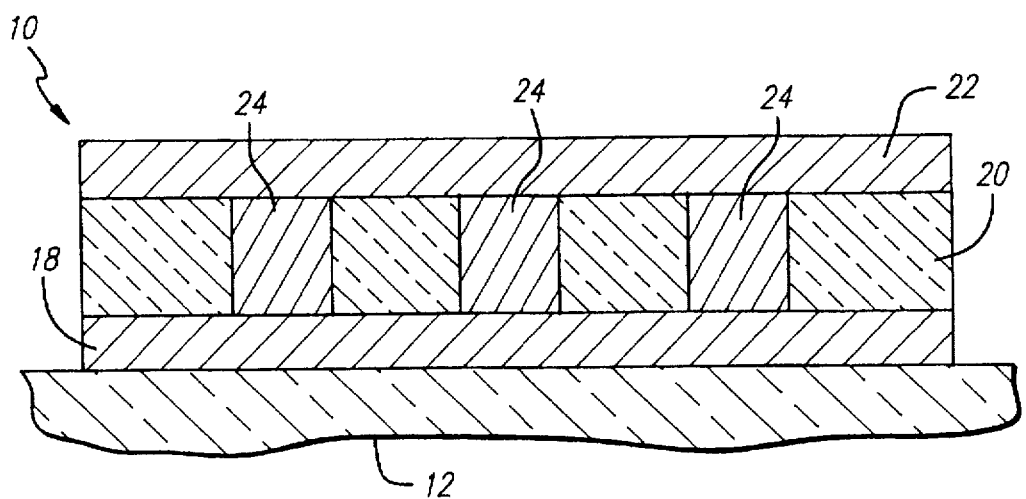
FIG. 3 is a sectional view taken on a line III—III of FIG. 1.

A multilevel metallization and ESD protection structure 10 according to the present invention is illustrated in FIGS. 1 to 3. The structure 10 comprises a semiconductor substrate 12 of a microelectronic integrated circuit. A microelectronic device 14 and an Input/Output (I/O) pad 16 are formed on the substrate 12. The device 14 is typically a MOSFET, but the invention is not limited to any particular type of microelectronic device.

The device 14 and pad 16 are electrically interconnected by a first metal layer 18 which is formed on the and which constitutes part of an I/O line. Opposite ends of the layer 18 are connected to the device 14 and to the pad 16 respectively. Although not explicitly shown for simplicity of illustration, one or more insulating layers are typically formed between the metal layer 18 and substrate 12 so that there is not direct electrical connection between the metal layer 18 and the underlying material of the substrate 12.

In accordance with the present invention, an insulating or dielectric layer 20 is formed over the first metal layer 18, and a second metal layer 22 is formed over the dielectric layer 20. The second metal layer 22 is electrically connected at its right end as viewed in the drawings to the pad 16. In this manner, the pad 16 is connected to both of the metal layers 18 and 22.

A plurality of electrically conductive Vertical Interconnects (vias) 24 are formed through the dielectric layer 20 and electrically connected at their vertical ends to the first and second metal layers 18 and 22 respectively. As viewed in the drawings, several rows of vias 24 are provided such that the vias of each row are longitudinally spaced along the length of the metal layers 18 and 22. In this manner, the layers 18 and 22 are electrically interconnected to each other along their lengths.

The present structure 10 enables current to flow between the device 14 and the pad 16 through both metal layers 18 and 22 and the vias 24, which in combination constitute an I/O line. This doubles the current carrying capacity of the I/O line structure which interconnects the device 14 and pad 16 over the capacity of the first metal layer 18 alone.

The increased current carrying capacity enables the widths of the first and second metal layers 18 and 22 to be substantially reduced compared to the prior art, while still carrying the required amount of current. Thus, the scale of integration can be substantially increased over the prior art by reducing the widths of the I/O lines, thereby enabling more I/O lines to be formed in the same sized area on a chip.

The metal lines 18 and 22 can be formed of any suitable electrically conductive material such as aluminum, copper, gold, etc. The metal lines 18 and 22 typically have a thickness of approximately 5,000 to 10,000 Angstroms, and a width of approximately 5 to 50 micrometers.

The dielectric layer 20 is typically formed of an electrically insulative material such as silicon dioxide, and has a thickness of approximately 8,000 to 20,000 Angstroms. It will noted that these values are exemplary only, and do not constitute limits to the scope of the invention.

Since microelectronic devices are typically interconnected by the first metal layer 18, it is convenient to connect the device 14 directly to the pad 16 using the first metal layer 18. However, the invention is not so limited.

Figure 4:
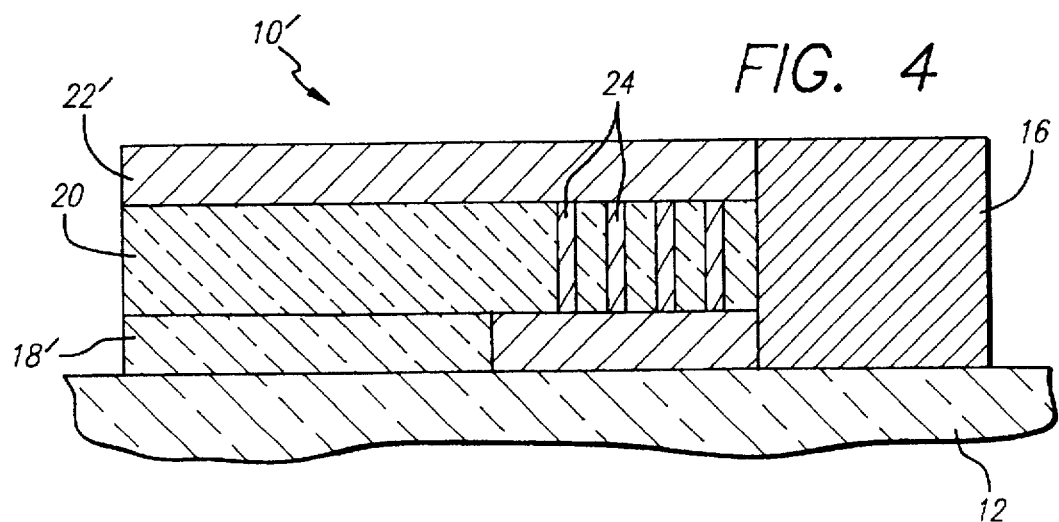
FIG. 4 is similar to FIG. 2, but illustrates another embodiment of the invention.

FIG. 4 illustrates a structure 10' in which like elements are designated by the same reference numerals used in FIGS. 1 to 3, and corresponding but modified elements are designated by the same reference numerals primed.

The structure 10' differs from the structure 10 in that the device 14 is connected directly to the pad 16 using the second metal layer 22' rather than the first metal layer 18'.

It is further within the scope of the invention to interconnect the device 14 and pad 16 using both metal layers 18 and 22. In this case, the vias 24 can be omitted, although it is preferred to include the vias 24 to enhance the current carrying capacity and current distribution in the I/O line.

Figure 5:
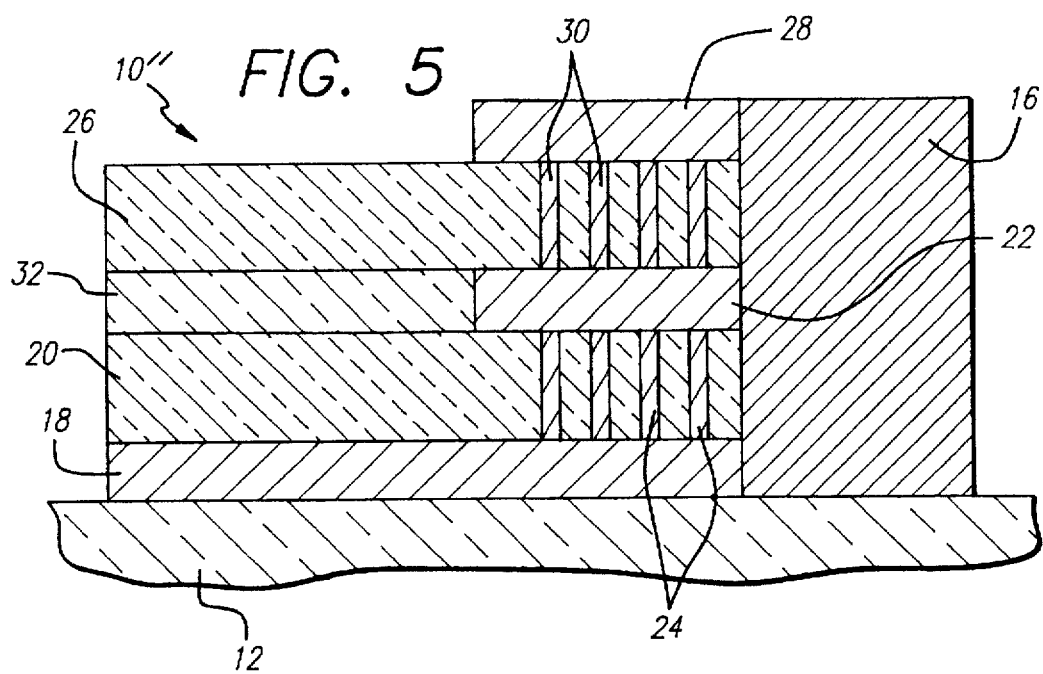
FIG. 5 is similar to FIG. 2, but illustrates yet another embodiment of the invention.

FIG. 5 illustrates another structure 10" according to the present invention, which includes a second dielectric layer 26, a third metal layer 28, and vias 30 which interconnect the second and third metal layers 22 and 28.

In FIG. 5, the device 14 is connected directly to the pad 16 by the first metal layer 18 as described above with reference to FIGS. 1 to 3. However, it is further within the scope of the invention to directly interconnect the device 14 and pad 16 using the one or more of the layers 18, 22 and 28 in any combination. Further illustrated is a third dielectric layer 32 which fills the space between the first and second dielectric layers 20 and 26 respectively.

It is within the scope of the invention to expand the embodiment of FIG. 5 by adding more metal and dielectric layers with corresponding vias.

Figure 6:
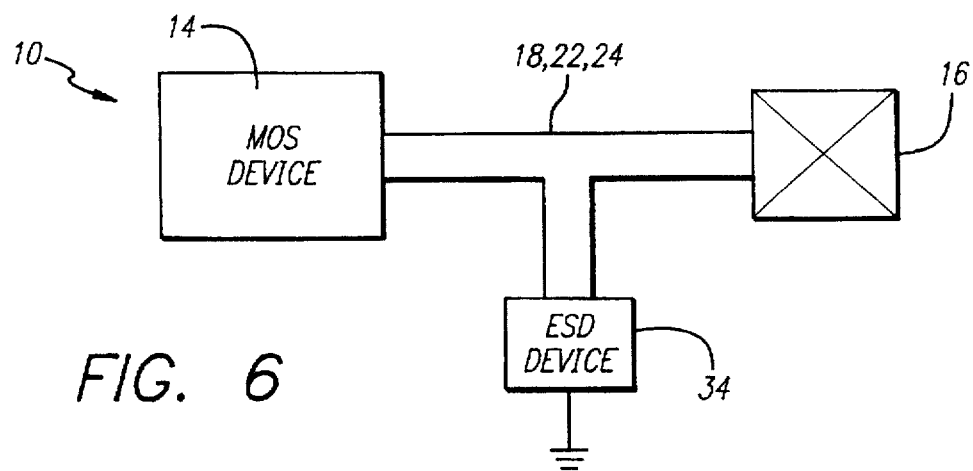
FIG. 6 is a diagram illustrating an electrostatic discharge (ESD) protection arrangement including the structures of FIGS. 1 to 5.

FIG. 6 illustrates the present structure 10 as further including an ESD protection device 34 which is connected to either one or both of the metal layers 18 and 22. The detailed structure of the device 34 is not the particular subject matter of the present invention. The device 34 can provide ESD protection using any known mechanism, for example:

1. Diode breakdown.
2. Node-to-node punchthrough.
3. Gate-field-induced breakdown.
4. Parasitic pnpn diode (thyristor) latchup.

The device 34 can further incorporate a combination of these mechanisms, for example a breakdown diode and one of the other protection devices connected in parallel with the gate being protected.

During an ESD event, current flows from the pad 16 through the metal layers 18 and 22 and vias 24 to the protection device 34 which non-destructively shunts the current to ground or other reference potential and thereby prevents the high ESD voltage from being applied to the device 14.

Since the current carrying capacity of the electrical path leading from the pad 16 to the device 34 is increased in accordance with the present invention as described above, the widths of the metal layers 18 and 22 can be reduced over the prior while still maintaining the required resistance to high current flow during ESD events.

In summary, the present invention enables a higher scale of circuit integration by reducing the widths of the metal layers without reducing their combined current carrying capacity.

The increased current carrying capacity provided by the two metal layers and vias increases the resistance of the metal layers to damage induced by high current flow during ESD events.

Various modifications will become possible for those skilled in the art after receiving the teachings of the present disclosure without departing from the scope thereof.

We claim:

1. A metallization structure for electrically interconnecting a microelectronic device and an Input/Output (I/O) pad on a substrate of an integrated circuit, comprising:

a first electrically conductive metal layer which is electrically connected to the device and the pad at opposite ends thereof respectively;

a second electrically conductive metal layer which is connected to the pad at an end thereof;

a first dielectric layer formed which is formed between and electrically insulates the first and second metal layers from each other; and a plurality of first electrically conductive interconnects which are formed through the dielectric layer and electrically connected to the first and second metal layers at opposite ends thereof respectively.

2. A structure as in claim 1, in which the second metal layer is not connected directly to the device.

3. A structure as in claim 1, in which the electrically conductive interconnects are longitudinally spaced from each other between the device and the pad.

4. A structure as in claim 1, in which the first metal layer is formed on the substrate, and is further formed below the dielectric layer and below the second metal layer.

5. A structure as in claim 1, in which the first metal layer is formed above the dielectric layer and the second metal layer on the substrate.

6. A structure as in claim 1, further comprising:

a third metal layer which is connected to the pad at an end thereof, the third metal layer being located such that the second metal layer lies between the first and third metal layers;

a second dielectric layer formed which is formed between and electrically insulates the second and third metal layers from each other; and a plurality of second electrically conductive interconnects which are formed through the second dielectric layer and electrically connected to the second and third metal layers at opposite ends thereof respectively.

7. A structure as in claim 6, in which the third metal layer is not connected directly to the device.

8. A structure as in claim 1, in which the first and second metal layers each have a width in the range of approximately 5 to 50 micrometers.

9. A structure as in claim 8, in which the first and second metal layers each have a thickness in the range of approximately 5,000 to 10,000 Angstroms.

10. A structure as in claim 9, in which the dielectric layer has a thickness in the range of approximately 8,000 to 20,000 Angstroms.

11. An electrostatic discharge (ESD) protection structure for an integrated circuit including a microelectronic device and an Input/Output (I/O) pad formed on a substrate, comprising:

a first electrically conductive metal layer which is electrically connected to the device and the pad at opposite ends thereof respectively;

a second electrically conductive metal layer which is connected to the pad at an end thereof;

a first dielectric layer formed which is formed between and electrically insulates the first and second metal layers from each other;

a plurality of first electrically conductive interconnects which are formed through the dielectric layer and electrically connected to the first and second metal layers at opposite ends thereof respectively; and an electrostatic discharge protection device which is electrically connected to at least one of the first metal layer and the second metal layer.

12. A structure as in claim 11, in which the second metal layer is not connected directly to the microelectronic device.

13. A structure as in claim 11, in which the electrically conductive interconnects are longitudinally spaced from each other between the microelectronic device and the pad.

14. A structure as in claim 11, in which the first metal layer is formed on the substrate, and is further formed below the dielectric layer and below the second metal layer.

15. A structure as in claim 11, in which the first metal layer is formed above the dielectric layer and the second metal layer on the substrate.

16. A structure as in claim 11, further comprising:

a third metal layer which is connected to the pad at an end thereof, the third metal layer being located such that the second metal layer lies between the first and third metal layers;

a second dielectric layer formed which is formed between and electrically insulates the second and third metal layers from each other; and a plurality of second electrically conductive interconnects which are formed through the second dielectric layer and electrically connected to the second and third metal layers at opposite ends thereof respectively.

17. A structure as in claim 16, in which the third metal layer is not connected directly to the microelectronic device.

18. A structure as in claim 11, in which the first and second metal layers each have a width in the range of approximately 5 to 50 micrometers.

19. A structure as in claim 18, in which the first and second metal layers each have a thickness in the range of approximately 5,000 to 10,000 Angstroms.

20. A structure as in claim 19, in which the dielectric layer has a thickness of approximately 8,000 to 20,000 Angstroms.

* * * * *